United States Patent
Mashima et al.

(10) Patent No.: US 7,833,587 B2
(45) Date of Patent: Nov. 16, 2010

(54) METHOD FOR PLASMA-ENHANCED CHEMICAL VAPOR DEPOSITION AND APPARATUS FOR PLASMA-ENHANCED CHEMICAL VAPOR DEPOSITION

(75) Inventors: Hiroshi Mashima, Nagasaki (JP); Akira Yamada, Nagasaki (JP); Keisuke Kawamura, Nagasaki (JP); Kenji Tagashira, Nagasaki (JP); Yoshiaki Takeuchi, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 1067 days.

(21) Appl. No.: 10/518,371

(22) PCT Filed: Oct. 29, 2003

(86) PCT No.: PCT/JP03/13821

§ 371 (c)(1),
(2), (4) Date: Dec. 28, 2004

(87) PCT Pub. No.: WO2004/040631

PCT Pub. Date: May 13, 2004

(65) Prior Publication Data

US 2005/0272261 A1 Dec. 8, 2005

(30) Foreign Application Priority Data

Oct. 31, 2002 (JP) ............................. 2002-317539

(51) Int. Cl.
*H05H 1/24* (2006.01)
*C23C 16/00* (2006.01)
*B01J 19/08* (2006.01)
*G21H 1/00* (2006.01)
*G21H 5/00* (2006.01)
*H01F 41/00* (2006.01)

(52) U.S. Cl. ..................... 427/569; 427/248.1; 427/457
(58) Field of Classification Search ................. 427/569, 427/258.1, 457
See application file for complete search history.

(56) References Cited

U.S. PATENT DOCUMENTS 5,239,134 A * 8/1993 Pote et al. ............... 174/102 R (Continued)

FOREIGN PATENT DOCUMENTS

DE 42 42 894 A1 6/1994

(Continued)

*Primary Examiner*—Timothy Meeks
*Assistant Examiner*—Kelly M Gambetta
(74) *Attorney, Agent, or Firm*—Oblon, Spivak, McClelland, Maier & Neustadt, L.L.P.

(57) ABSTRACT

A method for making the characteristics of the distribution of film thickness uniform is provided, avoiding generation of phase differences among streams of high-frequency electric power by manipulating the electrical characteristics of cables through which the high-frequency electric power is transmitted. Coaxial cables (19a to 19h and 24a to 24h) having a standard length and vacuum cables (20a to 20h and 25a to 25h) are installed, then a film is formed on a substrate by actually supplying high-frequency electric power, and thereafter the condition of vapor deposition such as the thickness of the film is observed. Based on the observations, the full lengths of the coaxial cables which communicate with the feeding points and the electrodes which correspond with positions over the substrate which need to be adjusted are changed. The coaxial cables are installed again, and high-frequency electric power equivalent to that used in the previous operation is supplied to form a film. The distribution of the film formed on the substrate is made uniform by repeating the above operations.

10 Claims, 2 Drawing Sheets

U.S. PATENT DOCUMENTS

| | | |
|---|---|---|
| 5,474,727 A | 12/1995 | Perez |
| 5,733,511 A * | 3/1998 | De Francesco ......... 422/186.05 |
| 6,359,250 B1 * | 3/2002 | Blonigan et al. ....... 219/121.43 |
| 2001/0031542 A1 * | 10/2001 | Ito et al. .................... 438/482 |

FOREIGN PATENT DOCUMENTS

| | | |
|---|---|---|
| EP | 1 146 569 A2 | 10/2001 |
| EP | 1146569 A2 * | 10/2001 |
| JP | 2001-257098 | 9/2001 |
| JP | 2001-274099 | 10/2001 |
| JP | 2002-69653 | 3/2002 |

* cited by examiner

METHOD FOR PLASMA-ENHANCED CHEMICAL VAPOR DEPOSITION AND APPARATUS FOR PLASMA-ENHANCED CHEMICAL VAPOR DEPOSITION

TECHNICAL FIELD

The present invention relates to methods for plasma-enhanced chemical vapor deposition and apparatuses for plasma-enhanced chemical vapor deposition, by which a film is formed on a substrate using plasma in order to vapor deposit a substance on the substrate.

BACKGROUND ART

A method for plasma-enhanced chemical vapor deposition, by which a substance such as a semiconductor, for example, is vapor deposited on a substrate, has hitherto been carried out as follows using an apparatus for plasma-enhanced chemical vapor deposition having a vacuum film formation chamber.

This apparatus for plasma-enhanced chemical vapor deposition is provided with a substrate disposed in a vacuum atmosphere, a ground electrode which holds the substrate and is grounded, and a ladder-shaped electrode which is disposed in parallel with and opposite to the substrate at a distance. Plasma is generated between the ladder-shaped electrode and the substrate by introducing a gas for forming a film containing the aforesaid substance into this apparatus for plasma-enhanced chemical vapor deposition, and by feeding the ladder-shaped electrode with electric power from a high-frequency electric power feeding circuit. Then, the gas for forming a film is decomposed in the plasma, and the substance is vapor deposited on the substrate (for example, see Japanese Patent Application, First Publication (Kokai), No. 2001-274099).

When a film is formed on a substrate having a large area exceeding, for example, the dimensions (length by breath) of 1 m by 1 m using an apparatus for plasma-enhanced chemical vapor deposition as described above, in order to make the distribution of the thickness of the film, which is formed in the vacuum film formation chamber, uniform over the entirety of the substrate, measures are taken that makes the distribution of the voltage of a high-frequency electric power supply, which is applied between the ladder-shaped electrode and the substrate so as to generate plasma, uniform over the entirety of the substrate. For example, as disclosed in the above patent document, two streams of high-frequency electric power, which have the same frequency, but a difference in phase between one stream of high-frequency electric power and the other stream of high-frequency electric power, are generated by a high-frequency electric power feeding circuit, and are distributed to discharge electrodes which constitute the ladder-shaped electrode via a plurality of cables. Accordingly, generation of standing waves on the discharge electrodes, which inhibit provision of uniformity in the film thickness, is avoided, and the high-frequency electric power generated by the high-frequency electric power feeding circuit is stably supplied.

DISCLOSURE OF INVENTION

However, with an apparatus for plasma-enhanced chemical vapor deposition as described above, even if formation of a film is intended while stably supplying high-frequency electric power, which avoids generation of standing waves on the discharge electrodes as explained above, imbalance in the distribution of the film thickness occurs due to the ladder-shaped electrode. That is, a discharge electrode part by the central part of the substrate, the discharge electrode parts being flanked on both sides in the vicinity by other discharge electrode parts, and a discharge electrode part which is flanked only on the right or left side in the vicinity by another discharge electrode part and which is in the vicinity of an end part of the substrate, the end part being at an end in a direction at right angles to the direction of fed electric power, have different effects on the substrate due to differences in arrangement and structure. Therefore, there has been a problem in that localized imbalance in the distribution of the film thickness occurs, and characteristics of the distribution of the film thickness on a substrate having a large area have not been sufficiently improved.

In addition, due to the positions of errors or the like in settings where a plurality of cables communicate with a plurality of feeding points, it is difficult to make the electrical characteristics among the cables uniform, and there has been a problem similar to the above caused by phase differences which arise among the streams of high-frequency electric power transmitted through the cables.

The present invention was conceived in view of the above problems, and an object of the present invention is to provide a method for making the characteristics of the distribution of the film thickness uniform, avoiding generation of phase differences among the streams of the high-frequency electric power by manipulating the electrical characteristics of the cables through which the high-frequency electric power is transmitted.

In order to achieve the above object, the present invention employs the following measures.

In a method for plasma-enhanced chemical vapor deposition according to the present invention in which a discharge electrode and a substrate are disposed opposite to each other in a vacuum film formation chamber into which a gas for forming a film containing a substance has been introduced, and high-frequency electric power generated by a high-frequency electric power feeding circuit is fed to a plurality of feeding points provided to the discharge electrode through a plurality of external cables which are disposed outside the vacuum film formation chamber and then through a plurality of internal cables which are disposed inside the vacuum film formation chamber and which correspond with the external cables, respectively, so as to generate plasma between the discharge electrode and the substrate to vapor deposit the substance on the substrate, the method for plasma-enhanced chemical vapor deposition comprises adjusting phases of the high-frequency electric power at the feeding points by changing electrical characteristics of the external cables, the high-frequency electric power being fed to the plurality of feeding points.

Such a method as above enables an operation of adjusting the phases of the high-frequency electric power at the plurality of feeding points to be performed without an operation of adjusting constituent instruments inside the vacuum film formation chamber, including the internal cables, thereby improving operability.

That is, by changing the electrical characteristics of the external cables, occurrence of a phase difference among streams of the high-frequency electric power fed to the plurality of the feeding points can be restricted, the distribution of the voltage applied to the plasma generated can be made uniform, and the distribution of the thickness of a thin film formed on the substrate can be made uniform.

In a method for plasma-enhanced chemical vapor deposition according to the present invention, the phases of the high-frequency electric power at the feeding points, the high-frequency electric power being fed to the plurality of feeding points, may be adjusted by carrying out vapor deposition with change in electrical characteristics of the external cables, carrying out observations of the condition of the substance which has been vapor deposited on the substrate, and changing the electrical characteristics of the external cables on the basis of the observations.

Such a method as above determines on which external cable a phase should be changed among the plurality of external cables for supplying the high-frequency electric power to the plurality of feeding points, and what the electrical characteristic parameter of the external cable should be.

That is, since the cable on which the phase should be changed and the electrical characteristic parameter of the cable can be specified, occurrence of a phase difference among the streams of the high-frequency electric power fed to the plurality of feeding points can be restricted, and the distribution of the thickness of a thin film formed on the substrate can be made uniform.

In a method for plasma-enhanced chemical vapor deposition according to the present invention, the aforesaid electrical characteristics may be changed by changing lengths of the external cables.

Such a method as above enables an operation of adjusting phases of the high-frequency electric power at the plurality of feeding points to be performed by an operation of adjusting the exterior of the vacuum film formation chamber, thereby improving operability.

That is, by adjusting the lengths of the external cables, the phases can be changed or adjusted according to the wavelength of the high-frequency electric power which is transmitted through each external cable, and the distribution of the thickness of a thin film formed on the substrate can be made uniform.

In a method for plasma-enhanced chemical vapor deposition according to the present invention, the lengths of the external cables may be changed by attaching or detaching at least one connector.

Such a method as above can adjust the length of the cable with the length of the connector as a unit length.

That is, since the adjustment of the length of the external cable is carried out by changing the number of connectors inserted by at least one, the adjusting operation can be performed more easily than changing the length of the cable itself.

In a method for plasma-enhanced chemical vapor deposition according to the present invention, the external cable may be in a structure such that a conductor is surrounded by an insulating material, and the aforesaid electrical characteristics may be changed by changing a relative dielectric constant of the insulating material.

Such a method as above enables an operation of adjusting not only the phases, but also the wavelengths of the high-frequency electric power among the cables, to be performed.

That is, by adjusting the properties of the insulating material of the external cables, the wavelengths of the high-frequency electric power transmitted through the cables can be changed, the phases corresponding to the wavelengths can be changed or adjusted, and the distribution of the thickness of a thin film formed on the substrate can be made uniform.

In a method for plasma-enhanced chemical vapor deposition according to the present invention, the insulating material of the external cable may be polytetrafluoroethylene.

Such a method as above improves the insulation properties, the dimensional properties, and the operability of the external cables.

That is, since the insulation properties, the dimensional properties, and the operability of the external cables are improved, it becomes easy to change or adjust the phases of the high-frequency electric power transmitted through the cables, and the distribution of the thickness of a thin film formed on the substrate can be made uniform.

In an apparatus for plasma-enhanced chemical vapor deposition according to the present invention in which a discharge electrode and a substrate are disposed opposite to each other in a vacuum film formation chamber into which a gas for forming a film containing a substance is to be introduced, and high-frequency electric power generated by a high-frequency electric power feeding circuit is to be fed to a plurality of feeding points provided to the discharge electrode through a plurality of external cables which are disposed outside the vacuum film formation chamber and then through internal cables which are disposed inside the vacuum film formation chamber, so as to generate plasma between the discharge electrode and the substrate to vapor deposit the substance on the substrate, the length of each of the external cables as parts for adjusting phases of the high-frequency electric power at the plurality of feeding points has been changed.

Such an apparatus as above enables adjustment of the phases of the high-frequency electric power at the plurality of feeding points to be performed by manipulation of the sizes of the external cables without an operation of adjusting constituent instruments inside the vacuum film formation chamber, including the internal cables.

That is, by manipulating the external cables, the phases according to the wavelengths of the high-frequency electric power fed to the discharge electrodes can be changed or adjusted, and the distribution of the thickness of a thin film formed on the substrate can be made uniform.

In an apparatus for plasma-enhanced chemical vapor deposition according to the present invention in which a discharge electrode and a substrate are disposed opposite to each other in a vacuum film formation chamber into which a gas for forming a film containing a substance is to be introduced, and high-frequency electric power generated by a high-frequency electric power feeding circuit is to be fed to a plurality of feeding points provided to the discharge electrode through a plurality of external cables which are disposed outside the vacuum film formation chamber and then through a plurality of internal cables which are disposed inside the vacuum film formation chamber, so as to generate plasma between the discharge electrode and the substrate to vapor deposit the substance on the substrate, the relative dielectric constant of each of the external cables as parts for adjusting phases of the high-frequency electric power at the plurality of feeding points has been changed.

Such an apparatus as above enables adjustment of the phases of the high-frequency electric power at the plurality of discharge electrodes to be performed by manipulation of the insulating material of the external cables without an operation of adjusting constituent instruments inside the vacuum film formation chamber, including the internal cables.

That is, by adjusting the external cables, the wavelengths and the phases of the high-frequency electric power fed to the discharge electrodes can be changed or adjusted, and the distribution of the thickness of a thin film formed on the substrate can be made uniform.

BEST MODE FOR CARRYING OUT THE INVENTION

Figure 1:
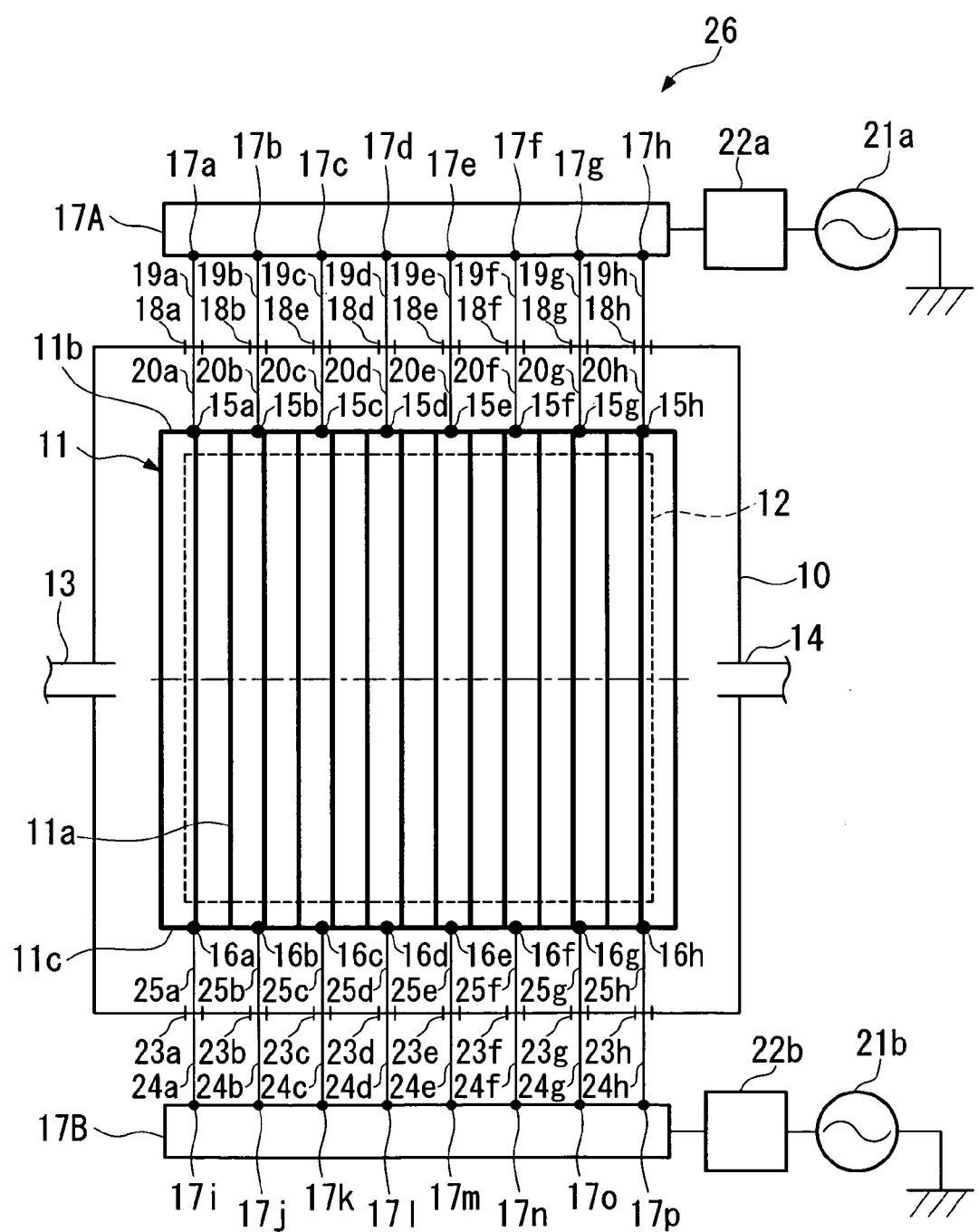
FIG. 1 is a block diagram showing a main part of an apparatus for plasma-enhanced chemical vapor deposition which is a realization of an embodiment of the present invention.

Next, embodiments of the present invention are described by referring to the drawings.

FIG. 1 is a block diagram showing a structure of a main part of an apparatus for plasma-enhanced chemical vapor deposition which performs a method for plasma-enhanced chemical vapor deposition according to a first embodiment of the present invention.

In FIG. 1, numeral 10 indicates a vacuum film formation chamber of the apparatus for plasma-enhanced chemical vapor deposition according to this embodiment. The vacuum film formation chamber 10 is provided with a ladder-shaped electrode 11 inside which is prepared as discharge electrodes, a ground electrode (not shown) which is disposed opposite to the ladder-shaped electrode 11 at a predetermined distance and is grounded, and a substrate 12 which is held by the ground electrode.

In addition, the vacuum film formation chamber 10 is equipped with a gas supply pipe 13 for introducing a gas for forming a film which is desired to be vapor deposited on the substrate 12, containing a substance such as amorphous silicon and polycrystalline thin-film silicon, and with a gas exhaust pipe 14 for discharging the gas which has undergone decomposition in plasma. The vacuum film formation chamber 10 is structured such that the gas for forming a film is supplied from a gas supply source, which is not shown, via the gas supply pipe 13, and that the gas which has undergone decomposition in plasma is drawn out via the gas exhaust pipe 14 by a vacuum pump, which is not shown.

The ladder-shaped electrode 11 is assembled in the form of a lattice from a plurality of longitudinal electrode rods 11a which are in parallel, and a pair of transverse electrode rods 11b and 11c which are disposed in parallel and opposite to each other. The transverse electrode rod 11b, which is a constituent of the ladder-shaped electrode 11, is provided, for example, with eight feeding points 15a to 15h. The transverse electrode rod 11c is also provided with eight feeding points 16a to 16h.

The feeding points 15a to 15h and the feeding points 16a to 16h are positioned so as to divide the transverse electrode rods 11b and 11c, respectively, into nine divisions of an equal length.

When the substrate 12 is a rectangle with the dimensions 1100 mm by 1400 mm, a ladder-shaped electrode 11 which is measurably larger than the substrate 12, that is, a rectangle with the dimensions about 1200 m by 1500 m, is used.

In order to feed, to the feeding points 15a to 15h in the ladder-shaped electrode 11, high-frequency electric power for generating plasma in which the gas for forming a film is decomposed, there are output terminals 17a to 17h of an electric power divider 17A which are disposed outside the vacuum film formation chamber 10, and connectors 18a to 18h which are installed on an outer wall of the vacuum film formation chamber 10.

In addition, as external cables which connect the output terminals 17a to 17h to the connectors 18a to 18h, respectively, eight coaxial (external) cables 19a to 19h, which are typical cables having an insulating material around a conductor, are provided. Eight vacuum (internal) cables 20a to 20h are provided so as to connect the feeding points 15a to 15h to the connectors 18a to 18h, respectively, inside the vacuum film formation chamber 10.

Here, the electric power divider 17A is provided as a divider for distributing the high-frequency electric power which is output from the high-frequency electric power supply 21a to the feeding points 15a to 15h in equal amounts. An input terminal of the electric power divider 17A is connected to the high-frequency electric power supply 21a via a matching box 22a for adjusting impedance matching between the electric power divider 17A and the high-frequency electric power supply 21a so that the high-frequency electric power can be efficiently supplied.

In a similar manner, output terminals 17i to 17p of an electric power divider 17B which are disposed outside the vacuum film formation chamber 10, and connectors 23a to 23h which are installed on an outer wall of the vacuum film formation chamber 10, are provided for feeding points 16a to 16h. The output terminals 17i to 17p and the connectors 23a to 23h are connected by eight coaxial cables 24a to 24h, respectively. The feeding points 16a to 16h and the connectors 23a to 23h are connected by 8 vacuum cables 25a to 25h, respectively. An input terminal of the electric power divider 17B is connected to the high-frequency electric power supply 21b via a matching box 22b.

Similar to the electric power divider 17A, the electric power divider 17B is a divider for distributing the high-frequency electric power which is output from the high-frequency electric power supply 21b to the feeding points 16a to 16h in equal amounts. In a manner similar to the matching box 22a, the matching box 22b is used for adjusting impedance matching between the electric power divider 17B and the high-frequency electric power supply 21b, so that the high-frequency electric power can be efficiently supplied.

The above ladder-shaped electrode 11, the coaxial cables 19a to 19h and 24a to 24h, the vacuum cables 20a to 20h and 25a to 25h, the electric power dividers 17A and 17B, the high-frequency electric power supplies 21a and 21b, and the matching boxes 22a and 22b constitute a high-frequency electric power feeding circuit 26 of the apparatus for plasma-enhanced chemical vapor deposition according to this embodiment.

Figure 2:
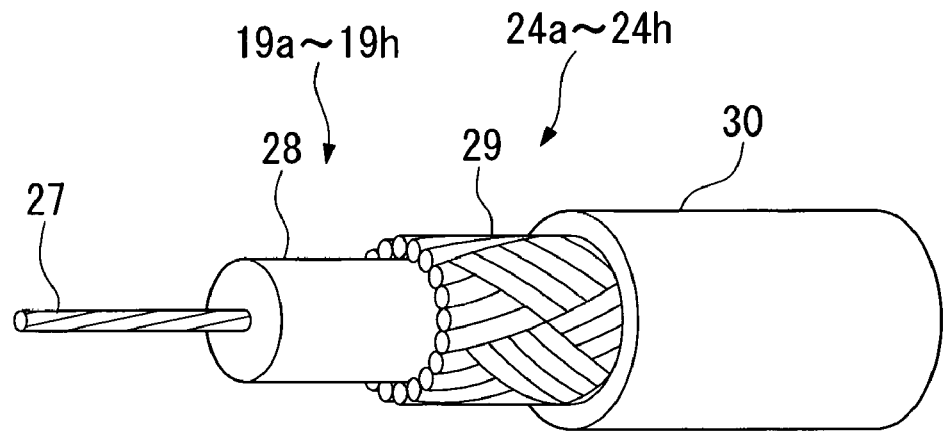
FIG. 2 is a structure of an external cable installed to an apparatus for plasma-enhanced chemical vapor deposition which is a realization of an embodiment of the present invention.

Each of the coaxial cables 19a to 19h and 24a to 24h as shown in FIG. 2 is composed of a core wire (conductor) 27 extending in one direction, an insulating material 28 which continuously covers the core wire 27, a metal mesh 29 which further continuously covers the insulating material 28, and a sheath 30 which continuously covers these at the outermost circumference.

Figure 3:
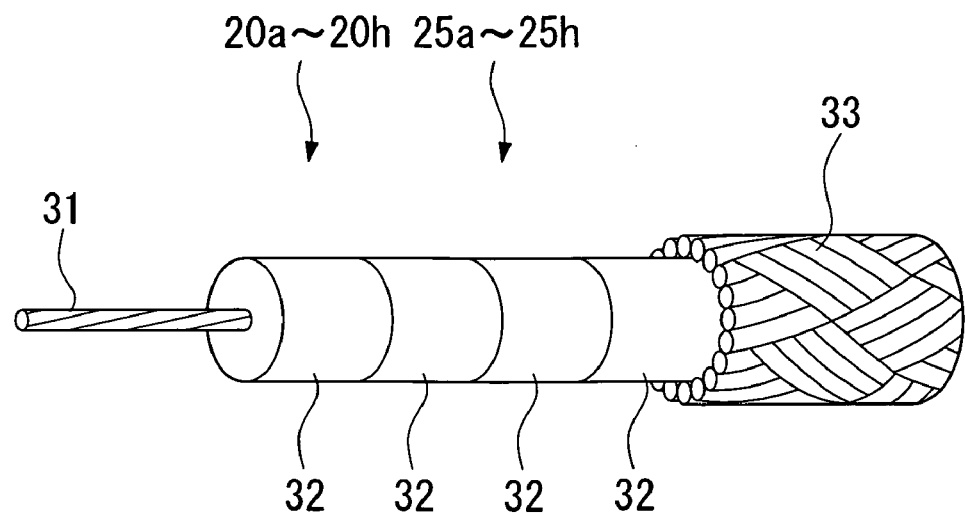
FIG. 3 is a structure of an internal cable installed to an apparatus for plasma-enhanced chemical vapor deposition which is a realization of an embodiment of the present invention.

Each of the vacuum cables 20a to 20h and 25a to 25h as shown in FIG. 3 is composed of a core wire 31 in the form of a strand extending in one direction, a plurality of insulators 32 which are next to each other without gaps to cover the surface of the core wire 31, and a metal mesh 33 which continuously covers these at the outermost circumference.

According to such a structure, with the apparatus for plasma-enhanced chemical vapor deposition according to this embodiment, a gas for forming a film containing, for example, amorphous silicone is introduced through the gas supply pipe 13 into the vacuum film formation chamber 10 which has been made into a vacuum, and at the same time, very-high-frequency (VHF) electric power having a frequency of, for example, 60.0 MHz from the high-frequency electric power supply 21*a* is distributed via the matching box 22*a* and the electric power divider 17A to the feeding points 15*a* to 15*h* in equal amounts and is fed to the ladder-shaped electrode 11.

On the other hand, very-high-frequency (VHF) electric power having a different phase and having a frequency of 60.0 MHz from the high-frequency electric power supply 21*b* is distributed via the matching box 22*b* and the electric power divider 17B to the feeding points 16*a* to 16*h* in equal amounts and is fed to the ladder-shaped electrode 11. At the same time, the overall electric power supplied from the high-frequency electric power supply 21*a* and the high-frequency power supply 21*b* is adjusted, for example, to be 3000 W.

When plasma, in which the gas for forming a film containing amorphous silicon is decomposed, is generated between the ladder-shaped electrode 11 and the substrate 12 for about 10 minutes in the above condition, the desired amorphous silicone is formed on the surface of the substrate 12 while the gas which has undergone decomposition in plasma is discharged through the gas exhaust pipe 14. At the same time, by supplying the ladder-shaped electrode 11 with two streams of high-frequency electric power which have the same frequency and have phases in which one stream of the high-frequency electric power has a phase which is shifted by a specific frequency with respect to the phase of the other stream of the high-frequency electric power, generation of standing waves on the ladder-shaped electrode 11, which inhibits provision of uniformity in the film thickness, is avoided, so that the distribution of voltage is made uniform, and thereby uniformity in the distribution of the film thickness in the direction of fed electric power can be promoted.

Next, a method for plasma-enhanced chemical vapor deposition is described by which the distribution of the film thickness is made uniform using coaxial cables 19*a* to 19*h* and 24*a* to 24*h* when a substance is vapor deposited on a substrate 12 as described above with the apparatus for plasma-enhanced chemical vapor deposition according to this embodiment.

The coaxial cables 19*a* to 19*h* and 24*a* to 24*h* have their insulation properties, dimensional properties, and operability improved using polytetrafluoroethylene as the insulating material 28 instead of conventional polyethylene standardized by JIS-C-3501.

Each of the vacuum cables 20*a* to 20*h* and 25*a* to 25*h* is in a structure such that the plurality of insulators 32 made of alumina with a predetermined length are continuously disposed without gaps on the surface of the core wire 31 in the direction in which the core wire 31 in the form of a strand extends.

Each of the above cables is installed to the vacuum film formation chamber 10 with a specific size.

In general, where $\varepsilon$ is the relative dielectric constant of an insulating material, $\mu$ is the relative magnetic permeability, c is the light velocity, and f is the frequency of high-frequency electric power, the wavelength $\lambda$ of the high-frequency electric power transmitted through the cable can be obtained from the following equation (1).

$$\lambda = \frac{1}{\sqrt{\varepsilon\mu}} \cdot \frac{c}{f} \qquad (1)$$

According to the above, since the wavelength of the high-frequency electric power transmitted through the coaxial cables 19*a* to 19*h* and 24*a* to 24*h* used in this embodiment is 3.45 m, if a shift by one wavelength is converted to a phase shift of 360°, a difference of 1 cm in the length of the cable leads to a shift of 1.04° in the phase.

On the other hand, since the wavelength of the high-frequency electric power transmitted through the vacuum cables 20*a* to 20*h* and 25*a* to 25*h* used in this embodiment is 1.66 m, if the same conversion as above is made, a difference of 1 cm in the length of the cable leads to a shift of 2.17° in the phase.

Accordingly, the phase of the high-frequency electric power can be adjusted by changing the lengths of the coaxial cables 19*a* to 19*h* and 24*a* to 24*h*, with which minute adjustment of the phase shifts is possible since the effect of the lengths of the cables on the phase shifts is small. That is, with a cable for use in an atmospheric environment, which exhibits a smaller phase shift per centimeter than a vacuum cable does, minute adjustment of the phase is easily carried out.

Therefore, first, the coaxial cables 19*a* to 19*h* and 24*a* to 24*h* having a standard length and the vacuum cables 20*a* to 20*h* and 25*a* to 25*h* are installed, then a film is formed on the substrate 12 by actually supplying high-frequency electric power, and thereafter the condition of vapor deposition such as the thickness of the film is observed.

Based on the observations, the full lengths of the coaxial cables which communicate with the feeding points and the electrodes which correspond with positions over the substrate 12 which need to be adjusted are changed. The coaxial cables are installed again, and high-frequency electric power equivalent to that used in the previous operation is supplied to form a film.

The distribution of the film formed on the substrate is made uniform by repeating the above operations.

For example, when the full length of each of the coaxial cables 19*b*, 19*c*, 19*f*, and 19*g* is extended 100 mm (which is equivalent to a phase delay of about 11°) longer than the other cables, the speed of film formation changes within the range of 10% to 40%, and the deviation in the distribution of the film thickness is improved from ±43.8% to ±39.6%.

According to the above method, by manipulating the lengths of the predetermined external cables on the basis of the distribution of the film formed on the substrate, a method for making the characteristics of the distribution of the film thickness uniform can be provided, avoiding generation of phase differences among the streams of the high-frequency electric power at the plurality of feeding points.

It should be noted that functions and effects similar to those obtained by changing the lengths of the coaxial cables can also be obtained without changing the lengths of the coaxial cables to be adjusted, by additionally inserting at least one of mutually similar connectors into a part of any of the connectors 18*a* to 18*h* and 23*a* to 23*h* and the output terminals 17*a* to 17*p*, to which the corresponding coaxial cables are connected.

Moreover, according to equation (1), if the relative dielectric constant of the insulating material of a coaxial cable is made 4 times larger, for example, the wavelength of the high-frequency electric power transmitted through the cable becomes ½. Therefore, the wavelength of the high-frequency electric power transmitted is changed even if the length of the coaxial cable is not changed. Accordingly, by installing coaxial cables having mutually different relative dielectric constants, occurrence of differences in electrical characteristics among the plurality of the feeding points can also be avoided, and a method for making the characteristics of the distribution of the film thickness uniform can be provided in a manner similar to the above.

Furthermore, the waveform of the above high-frequency electric power may be a triangle wave, a sine wave, or the like.

The invention claimed is:

1. A method for plasma-enhanced chemical vapor deposition in which a discharge electrode and a substrate are disposed opposite to each other in a vacuum film formation chamber into which a gas for forming a film containing a substance has been introduced, and high-frequency electric power generated by a high-frequency electric power feeding circuit is fed to a plurality of feeding points provided to the discharge electrode through a plurality of external cables which are disposed outside the vacuum film formation chamber and then through a plurality of internal cables which are disposed inside the vacuum film formation chamber and which correspond with the external cables, respectively, so as to generate plasma between the discharge electrode and the substrate to vapor deposit the substance on the substrate, wherein the discharge electrode is assembled from a plurality of longitudinal electrodes which are parallel to one another, and a pair of transverse electrodes which are parallel to one another, the transverse electrodes being perpendicular to the longitudinal electrodes and located at each end of the longitudinal electrodes, each of the transverse electrodes being provided with the plurality of feeding points;

wherein a plurality of high-frequency electric power supplies feed the high-frequency electric power to the plurality of the feeding points through the external cable and the internal cables;

wherein phases of the high-frequency electric power at the feeding points are adjusted by changing electrical characteristics of the external cables, the high-frequency electric power being fed to the plurality of feeding points; and wherein the phases of the high-frequency electric power at the feeding points, the high-frequency electric power being fed to the plurality of feeding points, are adjusted by carrying out vapor deposition with change in electrical characteristics of the external cables, carrying out observations of the condition of the substance which has been vapor deposited on the substrate, and changing the electrical characteristics of the external cables on the basis of the observations.

2. A method for plasma-enhanced chemical vapor deposition according to claim 1, wherein said electrical characteristics are changed by changing lengths of the external cables.

3. A method for plasma-enhanced chemical vapor deposition according to claim 2, wherein the lengths of the external cables are changed by attaching or detaching at least one connector.

4. A method for plasma-enhanced chemical vapor deposition according to claim 1, wherein the external cable is in a structure such that a conductor is surrounded by an insulating material, and said electrical characteristics are changed by changing a relative dielectric constant of the insulating material.

5. A method for plasma-enhanced chemical vapor deposition according to claim 4, wherein the insulating material of the external cable is polytetrafluoroethylene.

6. A method for plasma-enhanced chemical vapor deposition according to claim 1, wherein the discharge electrode assembled from the plurality of longitudinal electrodes are formed of electrode rods.

7. A method for plasma-enhanced chemical vapor deposition according to claim 1, wherein the transverse electrodes are formed of electrode rods.

8. A method for plasma-enhanced chemical vapor deposition according to claim 1, wherein the each of the transverse electrodes provides eight feeding points.

9. A method for plasma-enhanced chemical vapor deposition according to claim 8, wherein the eight feeding points divide the transverse electrodes into nine divisions of an equal length.

10. A method for plasma-enhanced chemical vapor deposition according to claim 1, further comprising:

supplying the plurality of longitudinal electrodes with a first stream and a second stream of high-frequency electric power having a same frequency;

setting a first phase of the first stream supplied to a first end of each of the longitudinal electrodes as a standard; and shifting a second phase of the second stream supplied to a second end of each of the longitudinal electrodes by a specific frequency with respect to the first phase of the first stream.

* * * * *